United States Patent
Nozieres et al.

(10) Patent No.: US 7,332,781 B2
(45) Date of Patent: Feb. 19, 2008

(54) MAGNETIC MEMORY WITH SPIN-POLARIZED CURRENT WRITING, USING AMORPHOUS FERROMAGNETIC ALLOYS, WRITING METHOD FOR SAME

(75) Inventors: Jean-Pierre Nozieres, Corenc (FR); Laurent Ranno, Grenoble (FR); Yann Conraux, Grenoble (FR)

(73) Assignee: Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 10/490,491

(22) PCT Filed: Sep. 19, 2002

(86) PCT No.: PCT/FR02/03210

§ 371 (c)(1),
(2), (4) Date: Oct. 7, 2004

(87) PCT Pub. No.: WO03/025942

PCT Pub. Date: Mar. 27, 2003

(65) Prior Publication Data

US 2005/0040433 A1 Feb. 24, 2005

(30) Foreign Application Priority Data

Sep. 20, 2001 (FR) .................................. 01 12124

(51) Int. Cl.
*H01L 29/82* (2006.01)
*H01L 43/00* (2006.01)

(52) U.S. Cl. .............................. 257/422; 257/E29.323; 365/33; 365/173; 365/225.5

(58) Field of Classification Search ................ 257/422, 257/E29.323; 365/33, 173, 225.5

See application file for complete search history.

(56) References Cited

U.S. PATENT DOCUMENTS

| 5,695,864 | A | 12/1997 | Slonczewski | 428/212 |
| 6,396,735 | B2 * | 5/2002 | Michijima et al. | 365/173 |
| 7,130,163 | B2 * | 10/2006 | Fukuzawa et al. | 360/324.1 |
| 2005/0094322 | A1 * | 5/2005 | Fukuzawa et al. | 360/324.1 |
| 2006/0203539 | A1 * | 9/2006 | Ikeda et al. | 365/158 |

FOREIGN PATENT DOCUMENTS

| EP | 1115164 A2 | 7/2001 |
| GB | 2343308 | 5/2000 |

OTHER PUBLICATIONS

"Magnetic Properties and Microstructure of Amorphous CO 100-X Tbx Thin Films", Kuo P.C. Et al., Journal of Applied Physics, American Institute of Physics, New York, vol. 84, No. 6, Sep. 15, 1998, pp. 3317-3321, XP000786541.

* cited by examiner

*Primary Examiner*—Ngân V. Ngô
(74) *Attorney, Agent, or Firm*—Duane Morris, LLP

(57) ABSTRACT

The invention concerns a magnetic memory, whereof each memory point consists of a magnetic tunnel junction (60), comprising: a magnetic layer, called trapped layer (61), whereof the magnetization is rigid; a magnetic layer, called free layer (63), whereof the magnetization may be inverse; and insulating layer (62), interposed between the free layer (73) and the trapped layer (71) and respectively in contact with said two layers. The free layer (63) is made with an amorphous or nanocrystallized alloy based on rare earth or a transition metal, the magnetic order of said alloy being of the ferromagnetic type, said free layer having a substantially planar magnetization.

15 Claims, 5 Drawing Sheets

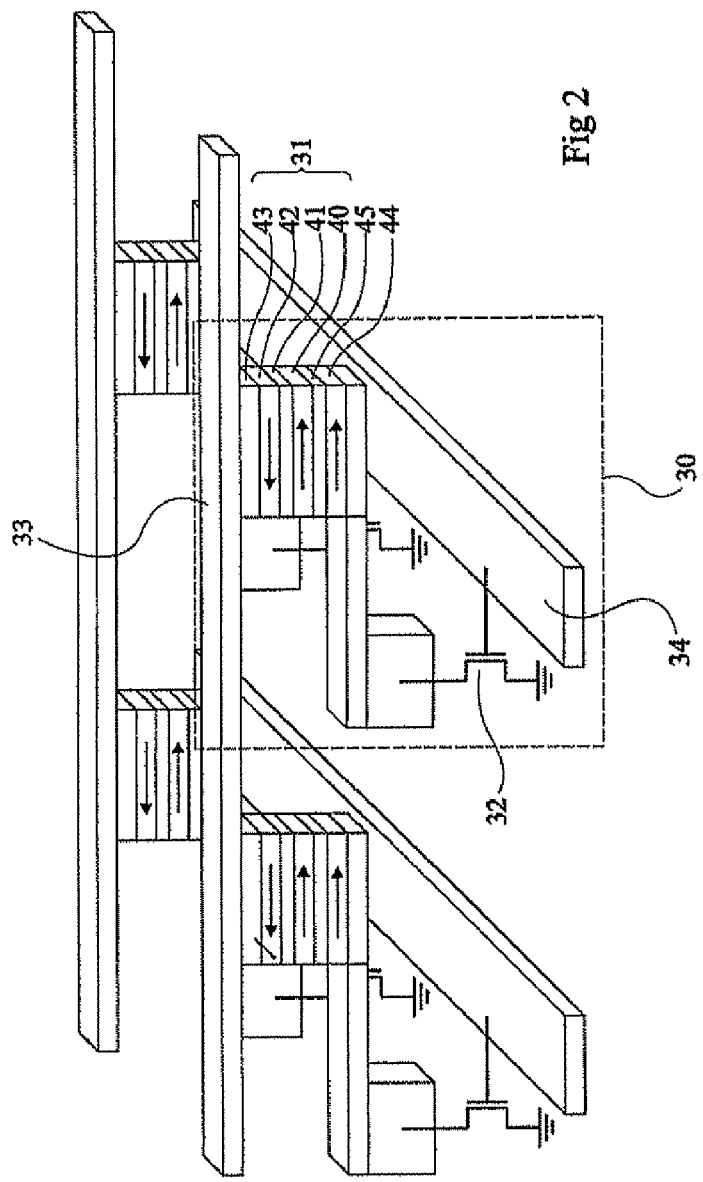

MAGNETIC MEMORY WITH SPIN-POLARIZED CURRENT WRITING, USING AMORPHOUS FERROMAGNETIC ALLOYS, WRITING METHOD FOR SAME

This application claims priority of the earlier filing date, under 35 U.S.C. 119, of the commonly owned PCT-based patent application, filing number PCT/FR02/03210, filed on Sep. 19, 2002, which claims priority of French Application No. 01/12124 filed on Sep. 20, 2001.

TECHNICAL FIELD

The present invention relates to the field of magnetic memories, and especially of non-volatile random access magnetic memories enabling storage and reading of data into and from electronic systems. More specifically, it relates to magnetic random access memories, called M-RAMs, formed of a magnetic tunnel junction.

STATE OF THE ART

Memories based on the charge state of a capacitor (DRAM, SRAM, FLASH) become more and more sensitive to ionizing radiations (such as, for example, cosmic rays) as the dimension of elementary transistors becomes smaller. Further, ferroelectric-based memories (FRAM) exhibit serious aging problems. Recent developments in the magneto-electronic field have enabled designing a novel type of memory based on the magnetoresistance of magnetic junctions. In other words, their operating principle no longer rests upon the storage of an electric load, but on the relative orientation of the magnetization of the elements forming it. Such magnetic random access memories (MRAM) have many advantages: their rapidity (a few nanoseconds of write and read time), their non-volatility, their lack of fatigue upon reading and writing, their insensitivity to ionizing radiations. They are first likely to replace flash memories and, on the longer term, to replace DRAMs and SRAMs to become a universal memory.

In the first magnetic memories, the memory point was formed of a so-called giant magnetoresistance element, formed of a stacking of several alternately magnetic and non-magnetic metal layers. A detailed description of this type of structure may be found in documents U.S. Pat. No. 4,949,039 and U.S. Pat. No. 5,159,513 for basic structures, and in document U.S. Pat. No. 5,343,422 for the forming of a RAM from such basic structures. This type of memory, due to its architecture, enables forming of non-volatile memories with a simple technology, but which have a limited capacitance. Indeed, the fact for the memory elements to be series-connected along each line limits integration possibilities, since the signal becomes lower and lower as the number of elements increases.

The most promising structures use for each memory point a magnetic tunnel junction—MTJ, formed in its simplest form of two magnetic layers of different coercitivities, separated by a thin insulating layer. A description of such structures is given in publication Physics Letters, volume 54A (1975), page 225, or more recently in publications Journal of Magnetism and Magnetic Materials, volume 139 (1995), page L139, and Physical Review Letters, volume 74 (1995), page 3273. The use of these structures for the MRAM manufacturing has been initially described in document U.S. Pat. No. 5,640,343.

Presently, the most promising structure seems to be that described in document U.S. Pat. No. 6,021,065 and in publication Journal of Applied Physics, volume 81 (1997), page 3758, the principle of which is schematically shown in FIG. 1. As can be seen in FIG. 1, each element or memory point (10) is formed of the association of a CMOS transistor (12) and of an MTJ junction (11). Said junction (11) comprises at least one magnetic layer (20), called the free layer, one thin insulating layer (21), and one magnetic layer (22), called the locked layer. Preferentially, but non limitingly, the two magnetic layers are formed based on 3d metals (Fe, Co, Ni) and their alloys, and the insulating layer is formed of alumina ($Al_2O_3$). Preferentially, the magnetic layer (22) is coupled with an antiferromagnetic layer (23) having the function of locking layer (22), so that its magnetization does not switch upon writing. Preferentially still, layer (22) may itself be formed of several layers, as described for example in document U.S. Pat. No. 5,583,725, to form a so-called synthetic antiferromagnetic layer. All these alterations, as well as others, are well known by those skilled in the art.

The architecture further comprises three line levels. The two line levels (14) (word line) and (15) (bit line), generally arranged with a 90° angle with respect to each other, are intended to transmit electric pulses capable of creating a magnetic field enabling switching of the magnetization of layer (20) in the writing process. The field pulses are generated by sending short current pulses (typically from 2 to 5 nanoseconds) with an intensity on the order of 10 mA along lines (14) and (15). The intensity of these pulses and their synchronization are adjusted so that only the magnetization of the memory point located at the crossing of these two lines can switch. An additional line level (16) (control line) is intended to control the opening or the closing of the channel of transistors (12) to be able to address each memory element individually upon reading. Transistors (12) are used as switches.

In write mode, the selected transistor (12) is in blocked or OFF mode, with no current running through it. A current pulse I is sent into the two lines (14) and (15) corresponding to the selected memory point (10). The amplitude of current pulse I is such that the created magnetic field is not sufficient to switch the memory points on lines (14) or (15), except at the intersection of said lines (14) and (15), where the joint contribution of the two lines is sufficient to have the magnetization of layer (20) of the memory point switch.

In read mode, transistor (12) is in saturated or ON mode by the sending of a positive current pulse into its base through control line (16), and the current flowing through it is maximum. A measurement current is then sent into line (14), which can cross the memory point having its transistor (12) in ON position only. With this current, a measurement of the resistance of junction (11) of the selected memory point (10) is performed. By comparison with a reference memory point not described herein, the corresponding state of memory point (10) (1 or 0) is thus determined.

As the process of writing into these memory points is described, the limits of such an architecture can be clearly understood:

Since the writing is ensured by an external magnetic field, it is subject to the individual switching field value of each memory point. If the switching field distribution function for all memory points is wide (indeed, it is not uniform due to manufacturing constraints), the magnetic field on the selected memory point must be greater than the highest switching field of said distribution function, at the risk of incidentally switching certain memory points located on the corresponding line and/or column, having its switching field, located in the low part of the distribution, smaller than the magnetic field generated by the line or column alone.

Conversely, if it is desired to ensure that no memory point is written into by a line or a column alone, the write current must be limited to never exceed for these memory points the magnetic field corresponding to the low part of the distribution, at the risk of never writing into the selected memory point at the intersection of said lines and columns, if its switching field is in the high part of the distribution. In other words, this architecture with a magnetic field selection by means of conductor lines and columns may easily result in write addressing errors. Given that it is expected that the distribution function of the switching fields of memory points is all the wider as their dimension is small, since the geometry of the memory points (shape, unevennesses, defects) dominates the magnetization switching, this effect can only worsen in future product generations.

Given that generally, the average value of the switching field increases as the memory point size decreases, a current which is so much the greater is expected in future product generations. Accordingly, the electric power required for the operation of these memories will be all the greater as the integration will be advanced.

The write mode by two current lines at 90° described hereabove requires three line levels. In particular, the transistor control line must be offset from the lower current line (required for the writing), which minimizes integration possibilities.

Finally, this write mode only enables writing into a single memory point at once to minimize the addressing error risk.

An alternative to this architecture has been provided. It consists of addressing the memory points for writing no longer with an external magnetic field, but with a spin-polarized electric current. Indeed, it has been predicted in publication Journal of Magnetism and Magnetic Materials, volume 159 (1996), page L1, that a spin-polarized current was able to cause a precession, or even a magnetization switching by transfer of the angular spin moment between the polarized carriers and the system's magnetic moment. More recently, this effect has been experimentally proved in all metal structures of reduced size (<100 nm), as described in publication Science, volume 285 (1999), page 867. Finally, the use of this technique for magnetic memories has been described in document U.S. Pat. No. 5,695,864. As can be seen in FIG. 2, in this architecture, memory point (30) comprises an MTJ junction (31) and a CMOS transistor (32), but there are now but two line levels (33) and (34), line (33) corresponding to the current lead for the reading and the writing, and line (34) corresponding to the transistor control which enables individually addressing each memory point (30). Transistors (32) are used as switches.

MTJ (31) is formed, as in the previously-described state of the art, of a so-called free magnetic layer (40), of a thin insulating layer (41) and a so-called locked magnetic layer (42), and of an antiferromagnetic layer (43), having the function of locking the magnetization of layer (42) in a fixed direction. Advantageously, an additional write current polarizing magnetic layer (44) may be added on the side of magnetic layer (40), separated therefrom by a non-magnetic layer of small resistivity (45).

In read mode, the system operates as in the state of the art, that is, transistor (32) corresponding to memory point (30) to be addressed is in saturated or ON mode by the sending of a positive current pulse into the base through control line (34). A measurement current of small intensity is then sent into line (33), which can only cross the single memory point having its transistor (34) in the ON position. With this current, the resistance of junction (31) of the selected memory point (30) is measured. By comparison with a reference memory point which is not described herein, the corresponding state of memory point (30) (1 or 0) is thus determined.

In write mode, the operation is radically different from the previously-described state of the art. The selected transistor (32) is in saturated or ON mode by the sending of a current pulse into line (34). A write current of strong intensity is sent over line (33), to only cross the selected memory point (30). The write current is polarized at the passing of magnetic layer (42) (or (44)) according to the current flow direction so that the spins of the electrons penetrating into magnetic layer (40) are in majority oriented along the magnetization direction of layer (42) (or (44)). When the amplitude of this strongly spin-polarized current is sufficient, the magnetization of magnetic layer (40) is switched. The writing by a spin-polarized current being, by nature, limited to one memory point, since only the memory point having its transistor in saturated or "ON" mode conducts the write current, addressing errors are intrinsically impossible. This write mode is thus much more reproducible than the method described in the state of the art. Another advantage of this technique, according to theoretical models currently in force, is that the current density necessary to the memory point magnetization switching is no longer subject to the switching field ($H_C$), which is an extrinsic property of the material, and thus dependent on its geometry and on the possible presence of defects, but to the magnetic anisotropy ($H_K$), which is an intrinsic property of the material and thus a priori controllable in much easier fashion. In particular, it is independent from the size and shape of the memory point, and thus the critical current density remains constant when the memory point size decreases, as expected in future product generations, conversely to the state of the art using a magnetic field generated by current lines, where the current necessary to the writing, and thus the consumption, increases as the memory point size decreases. Finally, it is possible to write into several memory points at once, which eases the data transfer speed.

Unfortunately, this architecture still has up to now a serious limitation. Indeed, the magnetization switching by injection of a polarized current requires significant current densities, which is not a problem for all metal structures, except for a significant electric consumption, but which results, in MTJ-type tunnel structures, in voltages across the junction which are greater than usual breakdown voltages (approximately 1 V, according to the thickness of insulating layer (41)). The main reason is given by relation (1) provided by publication Journal of Magnetism and Magnetic Materials 159 (1996) L1, which expresses the critical current according to the other structure parameters:

$$J_c = \frac{\alpha}{\eta} \frac{2e}{\hbar} t H_K M_s \left(1 \pm \frac{2\pi M_s}{H_K}\right) \quad (1)$$

where $\alpha$ is the damping coefficient, $\eta$ is the spin polarizing factor, t is the magnetic layer thickness, $H_K$ is the uniaxial magnetic anisotropic field, and $M_S$ is the magnetic layer magnetization. In this formula, term $2\pi M_S$, which corresponds to the demagnetizing field term of magnetic layer (40), considerably increases the current density required to observe the magnetization switching. Its influence can be understood by considering that upon switching of the magnetization of layer (40), said magnetization will precess on a cone around its initial direction and thus, to achieve this, come out of the layer plane. At the switching field, this precession is such that the magnetization of layer (40) is almost perpendicular to the layer plane, which is all the more difficult as the demagnetizing field is large.

The object of the present invention precisely is to strongly decrease the current density required for the writing, to avoid electric breakdown and minimize the electric consumption of the memory.

SUMMARY OF THE INVENTION

The present invention provides a structure of MTJ type, which minimizes the demagnetizing field to lower as much as possible the threshold current density required for the writing. For this purpose, it provides replacing usual ferromagnetic layers (20, 22) and (40, 42) described in relation with FIGS. 1 and 2 based on 3d metals (Fe, Co, Ni) and their alloys, with amorphous alloys based on rare earths and transition metals, called ferrimagnetic amorphous alloys (FAA) hereafter.

It thus provides a magnetic memory having each memory point formed of a magnetic tunnel junction, comprising:
a so-called locked magnetic layer having a rigid magnetization,
a so-called free magnetic layer having a magnetization that can be inverted,
an insulating layer, interposed between the free layer and the locked layer and at the respective contact of these two layers.

According to the present invention, the free layer is made of an amorphous or nanocrystallized alloy based on a rare earth and on a transition metal, the magnetic order of said alloy being of ferrimagnetic type, said free layer having a substantially planar magnetization.

"Planar magnetization" is used to imply that the magnetic moment is located in the plane of the considered layer, or substantially located in this plane, an angle from 10 to 30° with respect to said plane being considered as being encompassed by this definition.

According to the present invention, the writing into the memory points is performed by injecting an electric current via an electric conductor placed on each of said memory points, the electrons of said current being spin-polarized via the locked layer.

The foregoing objects, features, and advantages of the present invention will be discussed in detail in the following non-limiting description of specific embodiments in connection with the accompanying drawings.

BRIEF DESCRIPTION OF THE DRAWINGS

FIG. 2 is a simplified representation analogous to FIG. 1 of a magnetic memory enabling implementation of the writing by a polarized current of the present invention.

FIG. 5 is a more detailed simplified representation of memory point (60) of FIG. 4a.

DETAILED DESCRIPTION OF THE PRESENT INVENTION

Figure 1:
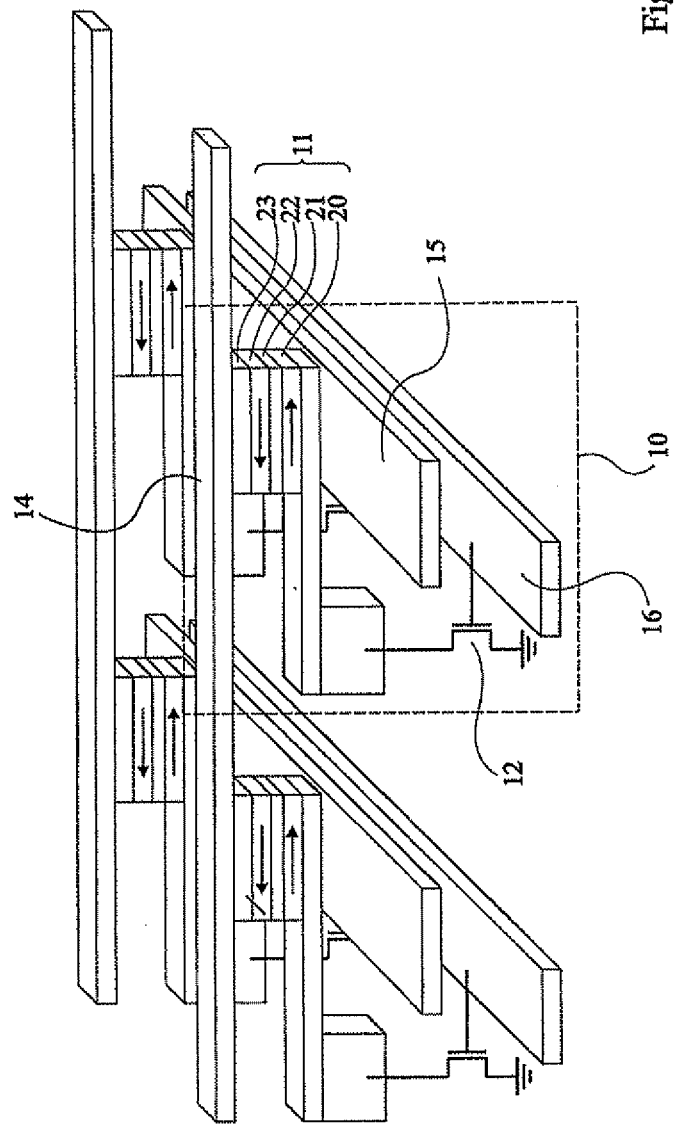
FIG. 1, previously described, is a simplified representation of the architecture of a magnetic memory of prior art having its memory points formed of an MTJ.
Figure 3A:
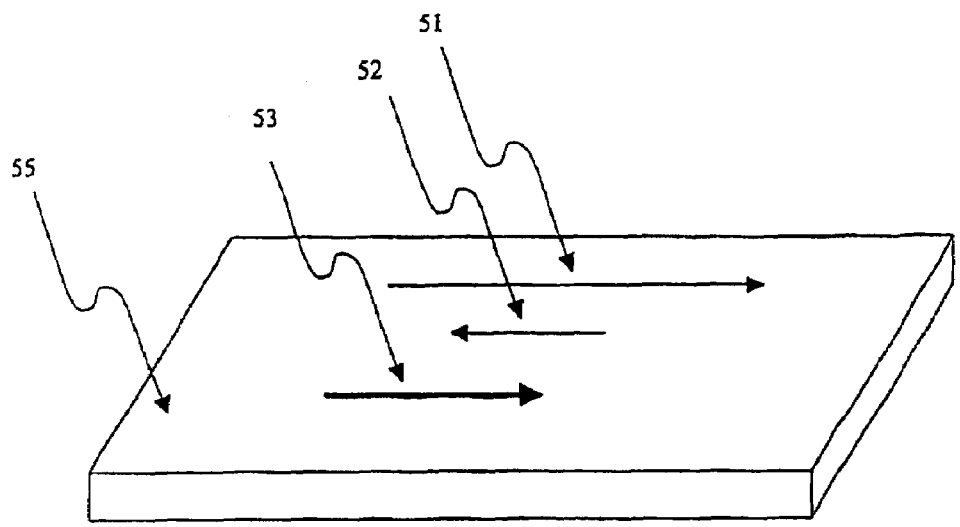
FIG. 3a is a simplified representation of the magnetization of an FAA.

As briefly reminded hereafter, the operation of the memory according to the present invention rests on the use of FAA materials and of the specific properties associated therewith. As can be seen in FIG. 3a, macroscopic magnetization (50) of a layer (55) of an FAA can be resolved into two contributions, one contribution due to rare earth atom sub-lattice (51) and one contribution due to transition metal atom sub-lattice (52). Schematically, macroscopic magnetization (50) results from the vectorial sum of the two sub-lattices (51) and (52).

Further, the magnetizations of rare earth lattice (51) and of transition metal sub-lattice (52) are strongly coupled together, resulting in a joint behavior upon switching of macroscopic magnetization (50) or reorientation by a selective excitation of one of sub-lattices (51) and (52).

Further, when the chemical nature and the relative composition of the rare earth and of the transition metal are judiciously selected, the magnetic order is of ferrimagnetic type, that is, the magnetization of the rare atom sub-lattice (51) points along one direction while the magnetization of the transition metal sub-lattice (52) points along the opposite direction. As can be seen in FIG. 3a, if the absolute value of magnetizations (51) and (52) of the two sub-lattices is not equal, the macroscopic magnetic moment (50) of the FAA as a whole is non-zero.

Figure 3B:
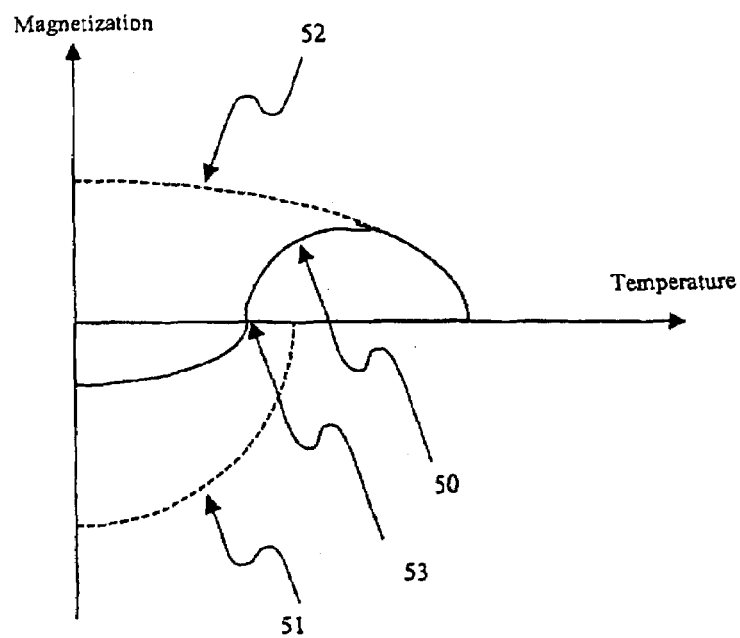
FIG. 3b is a curve representing the variation of the magnetization of an FAA according to temperature.

Further, as can be seen in FIG. 3b, the temperature variations of magnetizations (51) of the rare earth sub-lattice, and (52) of the transition metal are very different, resulting in a variation with the temperature of the relative significance of the contributions of the two sub-lattices to the resulting macroscopic magnetization. As a general rule, the magnetization of rare earth sub-lattice (51) decreases faster than the magnetization of transition metal sub-lattice (52). When the chemical nature and the relative composition of the rare earth and of the transition metal are judiciously chosen, for magnetizations (51) and (52) of the two sub-lattices to be antiparallel, there exists a temperature, called the compensation temperature (53), at which the two magnetizations are perfectly compensated for, that is, they have equal amplitudes and opposite signs, and thus the resulting macroscopic magnetization (50). Below the compensation temperature, rare earth sub-lattice (51) dominates and defines the direction of macroscopic magnetization (50). Above the compensation temperature, transition metal sub-lattice (52) dominates and determines the direction of the macroscopic magnetization (50).

Further, at compensation temperature (53), the coercitive field diverges and tends to infinity. On either side of the compensation temperature, the coercitive field decreases all the faster as the temperature is close to the compensation temperature (53).

Further, the electrons contributing to the magnetization of transition metal sub-lattice (52) mainly are the conduction electrons (3d electrons), that is, the electrons taking part in the electric current transmission. However, the electrons responsible for the magnetization of rare earth sub-lattice (51) are the core level electrons (4f electrons) which are localized and strongly shielded by the other system electrons.

Finally, the intrinsic properties of these FAAs (macroscopic magnetization, magnetic anisotropy, coercitive field)

may be very easily controlled by the chemical nature of the involved elements and their respective concentrations. Small amounts of substitution elements, generally transition metals, refractory metals, or rare earths, for example, but non-limitingly, Mo, Ta, Nb, Zr, Pt, Dy, and Sm, may also be added for this purpose. Such adjustments enable in particular obtaining materials with a planar magnetization as required for the free layer of the structures described in the present invention.

Among the FAAs considered in the present invention, one can preferentially, but non-limitingly, find the amorphous alloy of gadolinium (Gd) and cobalt (Co), for example, but non-limitingly, with composition $Gd_{30}Co_{70}$, which associates a ferrimagnetic order, a small magnetocrystalline anisotropy and, when the composition is judiciously selected, a compensation temperature close to the memory operating temperature.

Figure 4A:
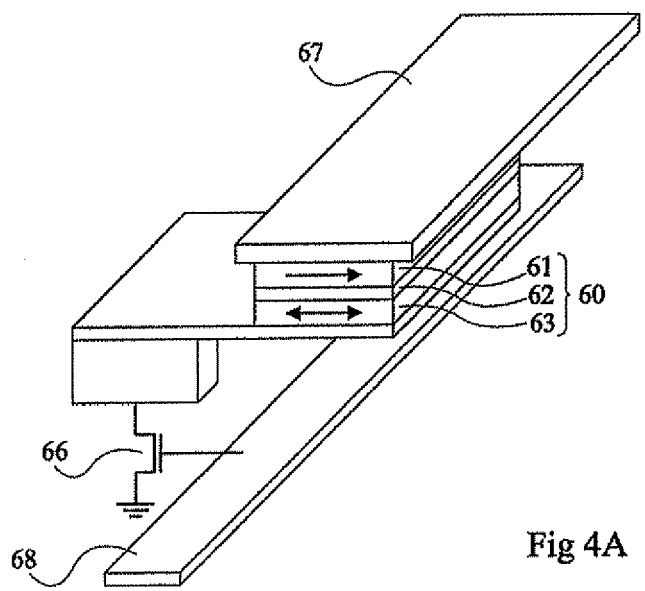
FIG. 4a is a simplified representation of a magnetic memory according to a first embodiment of the present invention.

As can be seen in FIG. 4a, the memory point of the memory according to the present invention is formed of an MTJ (60) comprising at least one magnetic layer (61) having a locked magnetization, an insulating layer (62) made of alumina, and an FAA alloy layer (63), the magnetization of which is desired to be switched to write into memory point (60). A current conductor line (67) is placed on memory point (60) and a transistor (66), controlled by current line (68), is placed under memory point (60) as in the state of the art.

Figure 4B:
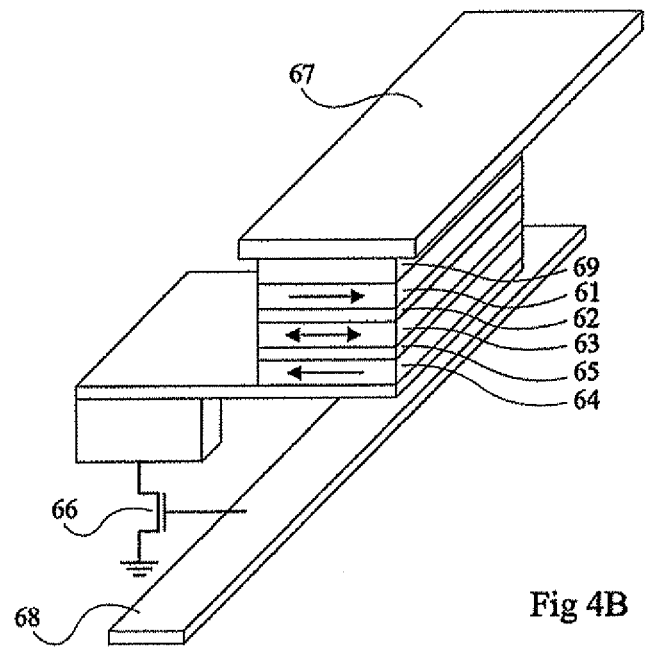
FIG. 4b is a simplified representation of a magnetic memory according to a second embodiment of the present invention.

Advantageously, as can be seen in FIG. 4b, an antiferromagnetic layer (69) is placed on locked layer (61) to block its magnetization.

Further, as can also be seen in FIG. 4b, an additional magnetic polarizing layer (64) is placed under layer (63), from which it is separated by a non-magnetic metal layer (65), for example gold. This additional polarizing layer (64), for example formed based on a terbium and cobalt alloy, may have a magnetization parallel or perpendicular to the plane of the layers constitutive of MTJ (60). This layer is also intended to ensure the spin polarizing of the current pulses upon writing, when said pulses are conveyed by the lower current line, especially by conductor (68) connected to transistor (66).

Advantageously, magnetic layer (61) may be formed of an FAA alloy identical to or different from layer (63), having a large switching field, for example, a terbium and cobalt based alloy. The chemical nature of layers (64) and (65) matters little in the system operation.

Figure 5:
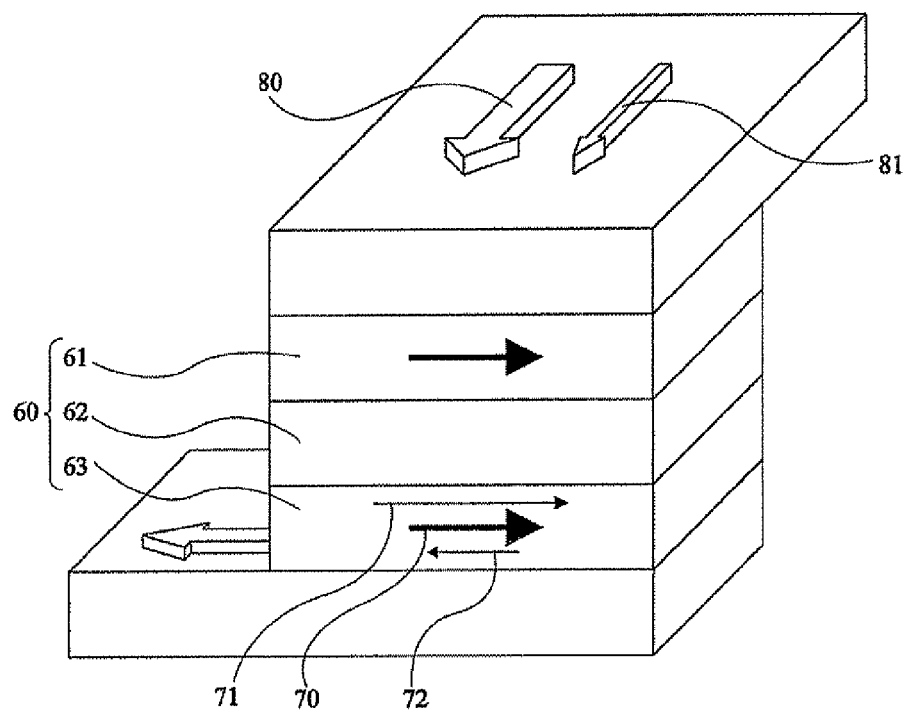

The write process can be described as follows, as shown in FIG. 5, which is an enlarged view of memory point (60) of FIG. 4a.

A write current (80) of strong amplitude is injected into MTJ (60). By crossing layer (61), current (80) is strongly spin-polarized when it penetrates into layer (63), the magnetization of which is desired to be switched. Given the specific nature of the previously-described electronic properties of layer (63), the electrons injected by write current (80), strongly spin-polarized, will mainly interact with the sub-lattice of transition metal (72), resulting in a transfer of the angular spin moment between the polarized carriers of the injected current (80) and the magnetic moment of the atoms of said transition metal sub-lattice (72). Due to the strongly shielded nature of the electrons responsible for the magnetism in rare earth atom sub-lattice (71), the interaction of write current (80) with said electrons is very small. Accordingly, injected current (80) mainly only sees a single direction of the magnetization in layer (63), that of transition atom sub-lattice (72), which enables switching of said sub-lattice if the necessary amplitude and duration conditions of said current (80) are respected. Due to the significant coupling between sub-lattices (71) and (72), sub-lattice (71), although little excited by injected current (80), follows sub-lattice (72), which enables complete switching of the layer magnetization (63).

It must be specified that the magnetization of polarizing layer (64) can essentially be in the plane or perpendicular to the plane. According to models in force, if the magnetization is in the plane, the magnetization of free layer (63) will precess around the axis defined by the spin direction of the electrons injected into the free layer, then damp parallel to this direction. The current pulse duration must then be sufficiently long to enable the precession, then the damping, to be performed. If the polarizing layer magnetization is perpendicular to the plane, the free layer magnetization will then precess around an axis perpendicular to the layer plane, that is, remaining in the plane of said free layer. If it is desired for the free layer magnetization to switch in its plane by 180°, the write current pulse duration must then be adjusted for the magnetization to only perform half a precession rotation in its plane.

On reading, a measurement current (81) of small amplitude is injected into MTJ (60) and the value of its resistance is read by comparison with a reference cell, which is not described in FIG. 3, as in the state of the art. Here again, advantage is taken of the specific nature of the electronic properties of FAAs: for the same reasons as described hereabove, the diffusion of the electrons injected by read current (81) is in large majority linked to transition atom sub-lattice (72), enabling differentiation of the state of memory point (60) according to whether the magnetization of sub-lattice (72) points along one direction or along the opposite direction. Further, the strong electric resistance of layer (63), linked to its amorphous nature, is no obstacle in the used geometry, since it is known by those skilled in the art that the tunnel magnetoresistance is essentially linked to the interfaces of magnetic layers (61) and (63) with insulating layer (62), and thus to a few atomic planes on either side of said interfaces.

The advantage of the present invention can thus be understood, since the obtained system enables writing with a spin-polarized current while keeping a low macroscopic magnetization, and thus a reduced absolute value of said write current. The value of said macroscopic magnetization being easily controllable by the chemical nature and/or the composition of the used FAA alloys, the write current can be adjusted at will. In particular, it may be chosen such that the voltage across the MTJ does not exceed a previously-determined critical value.

Advantageously, advantage can be taken of the strong resistivity of FAAs to further reduce the write current by using the local heating induced by the conjunction of the write current and of said strong resistivity. If the FAA has been judiciously selected, such a heating enables locally reducing the relative contribution of rare earth sub-lattice (71) with respect to transition metal sub-lattice (72), on the one hand, and decreasing the switching field of said transition metal sub-lattice, on the other hand.

Advantageously, magnetic layer (61) may be chosen to be made of an FAA alloy, preferentially in an FAA alloy with a strong switching field to overcome the need for a locking layer (69). Preferentially, but non-limitingly, layer (61) may be formed of a terbium and cobalt alloy, or of a samarium and cobalt alloy.

It can then be understood that by using an FAA exhibiting a small magnetic moment at the memory's operating temperature, which can be controlled at will by varying the concentration of the respective constituents of said FAA and the operating temperature of the memory point, it becomes possible to significantly decrease the current density applied upon writing without risking a breakdown of the magnetic tunnel junction. Indeed, the writing with a spin-polarized current can be used and the associated advantages can be enjoyed:

suppression of one of the current lines, and by corollary, positioning of the selection transistor under the memory point, resulting in an increased degree of integration.

individual addressing of said memory points, suppressing any addressing error risk, which could not be achieved with the standard crossed-conductor technology.

Further, the use of a free layer with a planar magnetization, that is, in the layer plane, enables reducing the pulse duration for the writing, thus optimizing the writing rapidity of this type of memory.

The invention claimed is:

1. A magnetic memory having memory points formed of a magnetic tunnel junction (60), comprising:
    a locked magnetic layer (61) having a rigid magnetization;
    a free magnetic layer (63) having a magnetization that can be inverted;
    an insulating layer (62), interposed between the free layer (63) and the locked layer (61) and in contact with these two layers; and
    write circuitry for sending an electric current in a selected one of the memory points to be written into, said current being spin-polarized by the locked layer (61), wherein the free layer (63) is made of an amorphous or nanocrystallized alloy based on a rare earth and a transition metal, the magnetic order of said alloy being of ferrimagnetic type, said free layer (63) having a substantially planar magnetization.

2. The magnetic memory of claim 1, wherein the free layer (63) is made of a gadolinium and cobalt alloy.

3. The magnetic memory of claim 1, wherein the free layer (63) further contains a small amount of one or several substitution elements.

4. The magnetic memory of claim 3, wherein the substitution elements are selected from the group comprising, for example, Zr, Mo, Nb, Ta, Pt, Dy, Sm.

5. The magnetic memory of claim 1, wherein the locked layer (61) is made of an amorphous alloy based on a rare earth and a transition metal, the magnetic order in said alloy being of ferrimagnetic type.

6. The magnetic memory of claim 5, wherein the locked layer (61) is made of a terbium and cobalt based amorphous alloy.

7. The magnetic memory of claim 1, wherein the locked layer (61) is made of an amorphous alloy based on a rare earth and a transition metal, the magnetic order in said alloy being of ferromagnetic type.

8. The magnetic memory of claim 7, wherein the locked layer (61) is made of a samarium and cobalt alloy.

9. The magnetic memory of claim 1, wherein each of the memory points further comprises an additional ferromagnetic layer, (64) positioned on a side of the free layer (63) opposed to and separated from said free layer by a non-magnetic metal layer (65), said additional ferromagnetic layer (64) for spin-polarizing the electrical current sent into the memory points when they are selected to be written into.

10. The magnetic memory of claim 9, wherein the additional polarizing layer (64) has a magnetization perpendicular to the plane of the layers forming the MTJ (60).

11. The magnetic memory of claim 9, wherein the additional polarizing layer (64) has a magnetization parallel to the plane of the layers forming the MTJ (60).

12. The magnetic memory of claim 9, wherein the additional polarizing layer (64) is made of a terbium and cobalt alloy.

13. The magnetic memory of claim 1, wherein each memory point is in contact on one of its surfaces with an electric conductor (67) and at its base with a selection transistor (66), the writing being performed at the level of a considered memory point by the sending of electric current pulses of strong amplitude into said conductor (67), said current being spin-polarized by the locked layer (61).

14. The magnetic memory of claim 13, wherein the spin polarizing of said current is further ensured by additional polarizing layer (64).

15. A random access magnetic memory, wherein it is formed according to any of claims 1 to 14.

* * * * *